US012586988B2

(12) United States Patent　　(10) Patent No.:　US 12,586,988 B2
He et al.　　(45) Date of Patent:　Mar. 24, 2026

(54) LASER COUPLING DEVICE

(71) Applicant: SHENZHEN ATOMSTACK TECHNOLOGIES CO., LTD., Shenzhen (CN)

(72) Inventors: Yun He, Shenzhen (CN); Huigang Lin, Shenzhen (CN); Zebin Li, Shenzhen (CN)

(73) Assignee: SHENZHEN ATOMSTACK TECHNOLOGIES CO., LTD., Shenzhen (CN)

( * ) Notice: Subject to any disclaimer, the term of this patent is extended or adjusted under 35 U.S.C. 154(b) by 756 days.

(21) Appl. No.: 17/884,582

(22) Filed: Aug. 10, 2022

(65) Prior Publication Data

US 2023/0361537 A1　　Nov. 9, 2023

(30) Foreign Application Priority Data

May 7, 2022　(CN) .......................... 202221076021.8
Jul. 8, 2022　(CN) ........................ 202210798315.X
Jul. 8, 2022　(CN) .......................... 202221766437.2

(51) Int. Cl.
　*H01S 5/40*　　(2006.01)
　*G02B 6/27*　　(2006.01)
　*G02B 27/10*　　(2006.01)

(52) U.S. Cl.
　CPC .......... *H01S 5/4012* (2013.01); *G02B 6/2773* (2013.01); *G02B 27/1006* (2013.01)

(58) Field of Classification Search
　CPC . H01S 5/4012; H01S 5/02251; G02B 6/2773; G02B 27/1006; G02B 27/283
　See application file for complete search history.

(56) References Cited

U.S. PATENT DOCUMENTS

| | | | | |
|---|---|---|---|---|
| 6,292,505 B1 * | 9/2001 | Takenaka | ................ | H01S 3/082 |
| | | | | 372/12 |
| 2002/0093744 A1 * | 7/2002 | Yamamoto | ......... | G02B 27/0068 |
| | | | | 359/691 |
| 2003/0063379 A1 * | 4/2003 | Fukuyama | ........... | G02B 21/006 |
| | | | | 359/359 |
| 2007/0268571 A1 * | 11/2007 | Hu | .......................... | H01S 3/005 |
| | | | | 372/50.23 |
| 2010/0246207 A1 * | 9/2010 | Furuya | ................... | G02B 6/001 |
| | | | | 362/458 |
| 2015/0331245 A1 * | 11/2015 | Tayebati | .................. | G02B 5/18 |
| | | | | 359/634 |
| 2022/0416502 A1 * | 12/2022 | Matsuo | .............. | H01S 5/02255 |

FOREIGN PATENT DOCUMENTS

CN　　112729019 A1　4/2021

OTHER PUBLICATIONS

First-OA-CN issued in corresponding application No. 202221766437.2, mailed Aug. 30, 2022.

* cited by examiner

*Primary Examiner* — Xinning(Tom) Niu

(57)　　ABSTRACT

The present disclosure relates to a laser coupling device, which includes a plurality of laser units, configured to emit laser beams; and at least one first convex lens, arranged on optical paths of the laser beams and configured to converge the laser beam. The laser coupling device can emit laser beam with a high power.

18 Claims, 3 Drawing Sheets

LASER COUPLING DEVICE

CROSS-REFERENCES TO RELATED APPLICATIONS

The present disclosure claims the benefits of Chinese Patent Application No. 202210798315X, filed on Jul. 8, 2022, Chinese Patent Application No. 202221766437.2, filed on Jul. 8, 2022, and Chinese Patent Application No. 202221076021.8, filed on May 7, 2022, the entire contents of which are incorporated herein for reference.

FIELD

This disclosure relates to a technical field of lasers, specifically to a laser coupling device.

BACKGROUND

Semiconductor laser has the advantages of reliability and low-cost, and is often used for engraving and cutting materials. However, due to its low heat dissipation, the maximum optical power of the existing semiconductor laser can only be about 5 W, which is difficult to meet the needs of industrial production.

SUMMARY

In order to resolve above-mentioned deficiency, the present disclosure provides a laser coupling device which can output a laser beam with a higher optical power.

A laser coupling device includes a plurality of laser units, configured to emit laser beams; and at least one first convex lens, arranged on optical paths of the laser beams and configured to converge the laser beam.

In at least one embodiment, the plurality of laser units include: a first laser unit, configured to emit a first laser beam; and a second laser unit, configured to emit a second laser beam. The laser coupling device includes: a half wave plate, arranged on an optical path of the second laser beam, and configured to change a polarization state of the second laser beam to obtain a third laser beam, the first laser beam and the third laser beam have different polarization states; and a polarization beam combiner, arranged on optical paths of the first laser beam and the third laser beam, and configured to combine the first laser beam and the third laser beam into a fourth laser beam, the first convex lens is configured to converge the fourth laser beam.

In at least one embodiment, the laser coupling device further includes a beam expander, arranged on an optical path of the fourth laser beam, and configured to shape the fourth laser beam, the first convex lens is configured to converge the fourth laser beam after being shaped by the beam expander.

In at least one embodiment, the beam expander includes: a concave lens, arranged on the optical path of the fourth laser beam; and a second convex lens, arranged on the optical path of the fourth laser beam, and between the concave lens and the first convex lens.

In at least one embodiment, a central thickness of the concave lens is 1.35~3 mm; and/or a curvature radius of the concave lens is 5.607~12.46 mm.

In at least one embodiment, a curved surface of the concave lens is configured to face the second convex lens; and/or a curved surface of the second convex lens is configured to face the first laser unit.

In at least one embodiment, a central thickness of the second convex lens is 2.25~5 mm; and/or a curvature radius of the second convex lens is 24.12~53.6 mm.

In at least one embodiment, the half wave plate is perpendicular to the second laser beam.

In at least one embodiment, the first laser beam and second laser beam have the same polarization state.

In at least one embodiment, the polarization beam combiner is arranged at an angle with the first laser unit; and/or the polarization beam combiner is arranged at an angle with the second laser unit.

In at least one embodiment, a quantity of the at least one first convex lens is more than one, and the first convex lenses are arranged parallel to each other.

In at least one embodiment, a central thickness of the first convex lens is 2.25~5 mm; and/or a curvature radius of the first convex lens is 24.12~53.6 mm; and/or a diameter of the first convex lens is 9.45~21 mm.

In at least one embodiment, a curved surface of the first convex lens is configured to face the laser units.

In at least one embodiment, the laser coupling device further includes a plurality of fast-axis collimation lenses, each of the fast-axis collimation lenses is arranged on one corresponding laser unit; a plurality of slow-axis collimation lenses, each of the slow-axis collimation lenses is arranged on one corresponding optical path of the laser beam, the fast-axis collimation lenses and the slow-axis collimation lenses are configured to collimate the laser beams; and a plurality of reflecting elements, each of the reflecting elements is arranged on one corresponding optical path of collimated laser beam, and configured to reflect the collimated laser beam.

In at least one embodiment, an aperture of the fast-axis collimation lens is 0.72~1.6 mm; and/or a focal length of the fast-axis collimation lens is 540~1200 μm; and/or a back focal length of the fast-axis collimation lens is 126~280 μm.

In at least one embodiment, a center thickness of the slow-axis collimation lens is 2.25~5 mm; and/or a curvature radius of the slow-axis collimation lens is 5.607~12.46 mm.

In at least one embodiment, a curved surface of the slow-axis collimation lens is configured to face the corresponding laser unit.

In at least one embodiment, the reflecting element is arranged at an angle with the slow-axis collimation lens.

In at least one embodiment, the laser coupling device further includes a plurality of input fibers, each input fiber is connected with one corresponding laser unit; a laser beam combiner, configured to combine the laser beams passing through the input fibers into one laser beam, and an output fiber, configured to transmit the laser beam to the at least one first convex lens.

In at least one embodiment, the laser beam combiner is a power combiner or a pump combiner.

In the technical solution of the present disclosure, the laser coupling device includes a plurality of laser units configured to emit laser beams, and a first convex lens arranged on optical paths of the laser beams. The first convex lens can converge the laser beams. The converged laser beam has a higher optical power and can be used to process the work piece well.

BRIEF DESCRIPTION OF THE DRAWINGS

Implementations of the present disclosure will now be described, by way of embodiment, with reference to the attached FIGS. It should be understood, the drawings are shown for illustrative purpose only, for ordinary person skilled in the art, other drawings obtained from these drawings without paying creative labor by an ordinary person skilled in the art should be within scope of the present disclosure.

DETAILED DESCRIPTION

Figure 1:
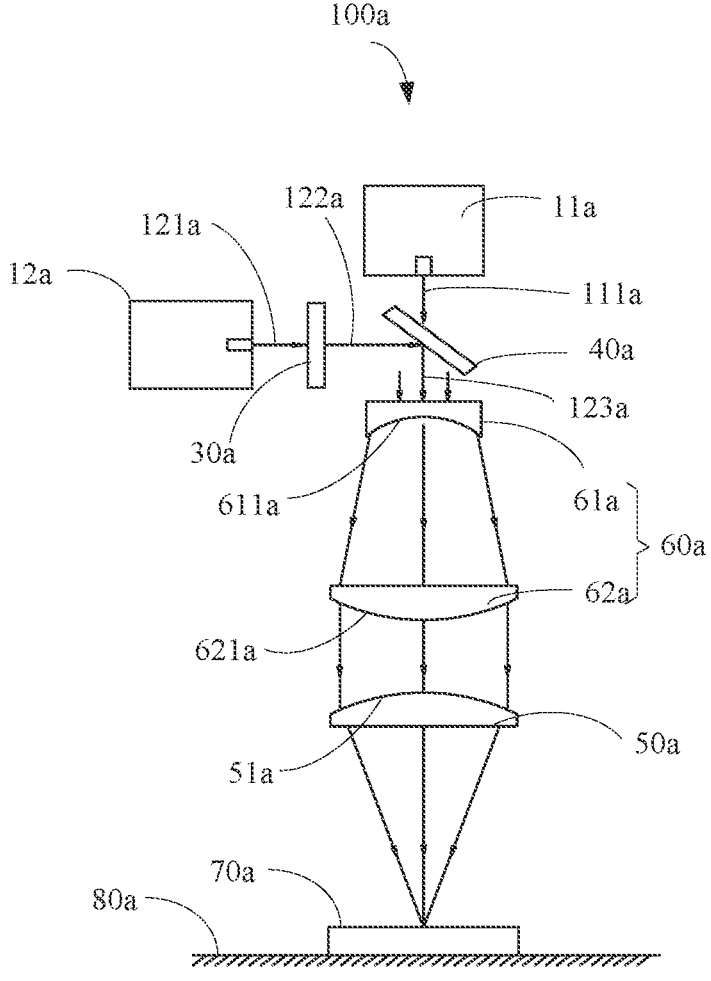
FIG. 1 is a schematic structure diagram of a laser coupling device according to a first embodiment of the present disclosure.

It will be appreciated that for simplicity and clarity of illustration, where appropriate, reference numerals have been repeated among the different drawings to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. the present disclosure is illustrated by way of example and not by way of limitation in the FIGS. of the accompanying drawings in which like references indicate similar elements. It should be noted that references to "an" or "one" embodiment in this disclosure are not necessarily to the same embodiment, and such references can mean "at least one". In addition, the terms "first" and "second" are used for descriptive purposes only and cannot be understood as indicating or implying relative importance or implying the number of indicated technical features. Thus, the features defined as "first" and "second" may explicitly or implicitly include one or more of the said features. In the description of embodiments of the application, "a plurality of" means two or more, unless otherwise specifically defined.

Please referring to FIG. 1, the present disclosure provides a laser coupling device 100a according to a first embodiment.

The laser coupling device 100a includes a plurality of laser units 10a configured to emit laser beams, and at least one first convex lens 50a arranged on optical paths of the laser beams and configured to converge the laser beam.

In at least one embodiment, the laser unit 10a may be a single-mode semiconductor laser, a semiconductor laser array, a multi-single-mode semiconductor laser, a semiconductor laser module including multi-single-mode semiconductor laser, or a semiconductor laser module including a semiconductor laser array.

In at least one embodiment, a quantity of the at least one first convex lens 50a is more than one, and the first convex lenses 50a are parallel to each other.

In at least one embodiment, a central thickness of the first convex lens 50a is 2.25~5 mm. For example, the central thickness of the first convex lens 50a is 2.25 mm, 2.5 mm, 3 mm, 3.5 mm, 4 mm, 4.5 mm, or 5 mm.

In at least one embodiment, a curvature radius of the first convex lens 50a is 24.12~53.6 mm. For example, the curvature radius of the first convex lens 50a is 24.12 mm, 26 mm, 30 mm, 35 mm, 40 mm, 45 mm, 50 mm, 55 mm, or 53.6 mm.

In at least one embodiment, a diameter of the first convex lens 50a is 9.45~21 mm. For example, the diameter of the first convex lens 50a is 9.45 mm, 10.5 mm, 12 mm, 15 mm, 20 mm, or 21 mm.

In at least one embodiment, a curved surface 51a of the first convex lens 50a is configured to face the laser units 10a.

In at least one embodiment, the laser coupling device 100a may be mounted on a heat sink 80a. A temperature of the heat sink 80a remains constant when the laser beam is irradiated on a surface of the work piece 70a, and the heat sink 80a can be atmosphere or ground.

In the technical solution of the present disclosure, the laser coupling device 100a includes a plurality of laser units 10a configured to emit laser beams, and a first convex lens 50a arranged on optical paths of the laser beams. The first convex lens 50a can converge the laser beams. The converged laser beam has a higher optical power and can be used to process the work piece 70a well.

It should to be understood that, the laser coupling device 100a of the present disclosure can output a laser beam with a high power. The first convex lens 50a with suitable focal length can be selected, to converge the laser beam and obtain the converged laser beam with suitable energy density and beam waist diameter. In this way, the laser coupling device 100a of the present disclosure can be adapted to different manufacturing processes. The laser beam with a larger beam waist diameter and a lower energy density is suitable for cutting materials, and the laser beam with a short beam waist diameter and a higher energy density is suitable for engraving materials.

The plurality of laser units 10a includes a first laser unit 11a configured to emit a first laser beam 111a, and a second laser unit 12a configured to emit a second laser beam 121a. The laser coupling device 100a includes a half wave plate 30a and a polarization beam combiner 40a. The half wave plate 30a is arranged on an optical path of the second laser beam 121a and configured to change a polarization state of the second laser beam 121a to obtain a third laser beam 122a, and the first laser beam 111a and the third laser beam 122a have different polarization states. The polarization beam combiner 40a is arranged on optical paths of the first laser beam 111a and the third laser beam 122a and configured to combine the first laser beam 111a and the third laser beam 122a into a fourth laser beam 123a, the first convex lens 50a is configured to converge the fourth laser beam 123a.

In at least one embodiment, an optical axe of the first laser unit 11a and an optical axe of the second laser unit 12a have the same height.

In at least one embodiment, the first laser unit 11a and the second laser unit 12a have the same structure.

In at least one embodiment, the first laser unit 11a and the second laser unit 12a have different structures.

In at least one embodiment, the first laser beam 111a and the second laser 121a have the same polarization state.

In at least one embodiment, the half wave plate 30a is perpendicular to the second laser 121a.

In at least one embodiment, the curved surface 51a of the first convex lens 50a is configured to face the first laser unit 11a.

In at least one embodiment, the polarization beam combiner 40a is arranged at an angle with the first laser unit 11a, and the polarization beam combiner 40a is also arranged at an angle with the second laser unit 12a. In detail, the angle between the polarization beam combiner 40a and the first laser unit 11a is 45°, and the angle between the polarization beam combiner 40a and the second laser unit 12a is 45°.

In at least one embodiment, the laser coupling device 100a may be mounted on the heat sink 80a, the temperature of the heat sink 80a remains constant when the fourth laser beam 123a is irradiated on one surface of the work piece 70a.

It should be understood that, the first convex lens 50a with suitable focal length can be selected, to converge the fourth laser beam 123a and obtain the converged laser beam with suitable energy density and beam waist diameter. In this way, the laser coupling device 100a of the present disclosure can be adapted to different manufacturing processes.

In the technical solution of the present disclosure, the first laser unit 11a emits the first laser beam 111a, the second laser unit 12a emits the second laser beam 121a. The polarization states of the first laser beam 111a and the second laser beam 121a can be the same. For example, the first laser beam 111a and the second laser beam 121a both have an S polarization state. After the second laser beam 121a passes through the half-wave plate 30a, the third laser beam 122a is formed, and the third laser beam 122a has a P polarization state. The first laser beam 111a and the third laser beam 122a with different polarization states are combined to form the fourth laser beam 123a, after passing through the polarization beam combiner 40a the fourth laser beam 123a are converged and has a high power. After the fourth laser beam 123a is converged by the first convex lens 50a, all the energy of the fourth laser beam 123a can also be concentrated, so as to process the work-piece 70a well.

The laser coupling device 100a further includes a beam expander 60a arranged on an optical path of the fourth laser beam 123a and configured to shape the fourth laser beam 123a, and the first convex lens 50a is configured to converge the fourth laser beam 123a after being shaped by the beam expander 60a.

In at least one embodiment, the beam expander 60a includes a concave lens 61a arranged on the optical path of the fourth laser beam 123a, and a second convex lens 62a arranged on the optical path of the fourth laser beam 123a. The second convex lens 62a is arranged between the concave lens 61a and the first convex lens 50a.

In at least one embodiment, a central thickness of the concave lens 61a is 1.35~3 mm. For example, the central thickness of the concave lens 61a is 1.35 mm, 1.5 mm, 2 mm, 2.5 mm, or 3 mm.

In at least one embodiment, a curvature radius of the concave lens 61a is 5.607~12.46 mm. For example, the curvature radius of the concave lens 61a is 5.607 mm, 6.23 mm, 7 mm, 8 mm, 10 mm, or 12.46 mm.

In at least one embodiment, a central thickness of the second convex lens 62a is 2.25~5 mm. For example, the central thickness of the second convex lens 62a is 2.25 mm, 2.5 mm, 3 mm, 3.5 mm, 4 mm, 4.5 mm, or 5 mm.

In at least one embodiment, a curvature radius of the second convex lens 62a is 24.12~53.6 mm. For example, the curvature radius of the second convex lens 62a is 24.12 mm, 26 mm, 30 mm, 35 mm, 40 mm, 45 mm, 50 mm, 55 mm, or 53.6 mm.

In at least one embodiment, a curved surface 611a of the concave lens 61a is configured to face the second convex lens 62a.

In at least one embodiment, a curved surface 621a of the second convex lens 62a is configured to face the first laser unit 11a.

In at least one embodiment, when the laser unit 10a includes a fast-axis collimation lens (not shown) and a slow-axis collimation lens (not shown), the concave lens 61a is a piano-concave lens, and the second convex lens 62a is a plano-convex lens.

In at least one embodiment, when the laser unit 10a includes a fast and slow axis collimation lens (not shown), the concave lens 61a is a cylindrical concave lens, and the second convex lens 62a is a cylindrical convex lens, the optical axis of the slow axis can be increased to equal to the optical axis of the fast axis, and the elliptical laser beam can be shaped into a circular laser beam.

In the technical solution of the present disclosure, the laser coupling device 100a further includes a beam expander 60a arranged on the optical path of the fourth laser beam 123a, the beam expander 60a is configured to shape the fourth laser beam 123a. The first convex lens 50a converges the fourth laser beam light 123a after being shaped by the beam expander 60a, so as to process the work piece 70a well.

Figure 2:
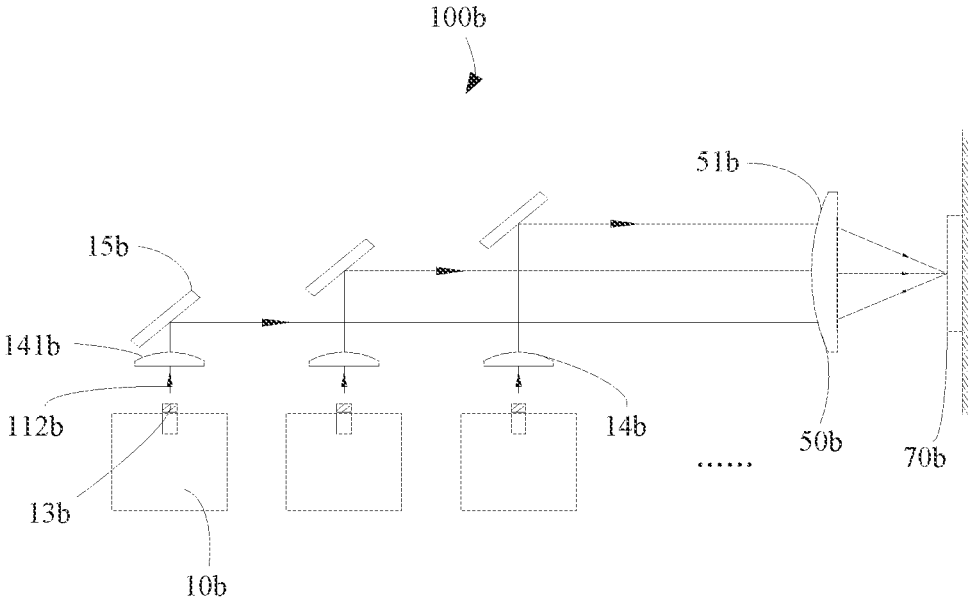
FIG. 2 is a schematic structure diagram of a laser coupling device according to a second embodiment of the present disclosure.

Please referring to FIG. 2, the present disclosure provides a laser coupling device 100b according to a second embodiment.

The laser coupling device 100b includes a plurality of laser units 10b, a plurality of fast-axis collimation lenses 13b, a plurality of slow-axis collimation lenses 14b, a plurality of reflecting elements 15b, and at least one first convex lens 50b. The laser units 10b are arranged at intervals and configured to emit laser beams 112b. Each of the fast-axis collimation lenses 13b is arranged on one corresponding laser unit 10b. Each of the slow-axis collimation lenses 14b is arranged on one corresponding optical path of the laser beam 112b. The fast-axis collimation lenses 13b and the slow-axis collimation lenses 14b are configured to collimate the laser beam 112b. Each of the reflecting elements 15b is arranged on one corresponding optical path of the collimated laser beam 112b and configured to reflect the collimated laser beam 112b towards the first convex lens 50b. The first convex lens 50b is arranged on optical paths of the reflected laser beams 112b and configured to converge the reflected laser beams 112b.

In at least one embodiment, the laser unit 10b may be a single-mode semiconductor laser, a semiconductor laser array, a multi-single-mode semiconductor laser, a semiconductor laser module including multi-single-mode semiconductor laser, or a semiconductor laser module including a semiconductor laser array.

In at least one embodiment, the first convex lens 50b has the same structure as the first convex lens 50a. So that, a central thickness of the first convex lens 50b is 2.25~5 mm. For example, the central thickness of the first convex lens 50b is 2.25 mm, 2.5 mm, 3 mm, 3.5 mm, 4 mm, 4.5 mm, or 5 mm. A curvature radius of the first convex lens 50b is 24.12~53.6 mm. For example, the curvature radius of the first convex lens 50b is 24.12 mm, 26 mm, 30 mm, 35 mm, 40 mm, 45 mm, 50 mm, 55 mm, or 53.6 mm. A diameter of the first convex lens 50b is 9.45~21 mm. For example, the diameter of the first convex lens 50b is 9.45 mm, 10.5 mm, 12 mm, 15 mm, 20 mm, or 21 mm.

In at least one embodiment, a curved surface 51*b* of the first convex lens 50*b* is configured to face the optical paths of the reflected laser beams 112*b*.

In at least one embodiment, a quantity of the at least one first convex lens 50*b* is more than one, and the first convex lenses 50*b* are parallel to each other.

In at least one embodiment, there is an included angle between the reflecting element 15*b* and the first convex lens 50*b*. Preferably, the angle between the reflecting element 15*b* and the first convex lens 50*b* is 45°.

In at least one embodiment, an aperture of the fast-axis collimation lens 13*b* is 0.72~1.6 mm. For example, the aperture of the fast-axis collimation lens 13*b* is 0.72 mm, 0.8 mm, 1 mm, 1.2 mm, 1.4 mm, or 1.6 mm.

In at least one embodiment, a focal length of the fast-axis collimation lens 13*b* is 540~1200 µm. For example, the focal length of the fast-axis collimation lens 13*b* is 540 µm, 600 µm, 700 µm, 800 µm, 900 µm, 1000 µm, 1100 µm, or 1200 µm.

In at least one embodiment, a back focal length of the fast-axis collimation lens 13*b* is 126~280 µm. For example, the back focal length of the fast-axis collimation lens 13*b* is 126 µm, 140 µm, 160 µm, 180 µm, 200 µm, 220 µm, 240 µm, 260 µm, or 280 µm.

In at least one embodiment, a center thickness of the slow-axis collimation lens 14*b* is 2.25~5 mm. For example, the center thickness of the slow-axis collimation lens 14*b* is 2.25 mm, 2.5 mm, 3 mm, 3.5 mm, 4 mm, 4.5 mm, or 5 mm.

In at least one embodiment, a curvature radius of the slow-axis collimation lens 14*b* is 5.607~12.46 mm. For example, the curvature radius of the slow-axis collimation lens 14*b* is 5.607 mm, 6.23 mm, 7 mm, 8 mm, 10 mm, or 12.46 mm.

In at least one embodiment, a curved surface 141*b* of the slow-axis collimation lens 14*b* is opposite to the laser unit 10*b*.

In at least one embodiment, the slow-axis collimation lens 14*b* is a lenticular lens.

In at least one embodiment, the fast-axis collimation lenses 13*b*, and the slow-axis collimation lens 14*b* can be replaced with fast and slow axis collimation lens (not shown).

In at least one embodiment, the reflecting elements 15*b* is arranged at an angle with the slow-axis collimation lens 14*b*. Specifically, the angle between the reflecting elements 15*b* and the slow-axis collimation lens 14*b* is 45 degrees.

In at least embodiment, the reflecting elements 15*b* can be a reflecting mirror.

In the technical solution of the present disclosure, the laser coupling device 100*b* includes a plurality of laser units 10*b*, a plurality of fast-axis collimation lenses 13*b*, a plurality of slow-axis collimation lenses 14*b*, a plurality of reflecting elements 15*b*, and a first convex lens 50*b*. The fast-axis collimation lenses 13*b* and the slow-axis collimation lenses 14*b* are configured to collimate the laser beams 112*b*, the reflecting elements 15*b* can reflect the collimated laser beams 112*b*. The reflected laser beams 112*b* are converged by the first convex lens 50*b*, and the converged laser beam 112*b* has a high power and can be used to process a certain area of the work piece 70*b* well.

Figure 3:
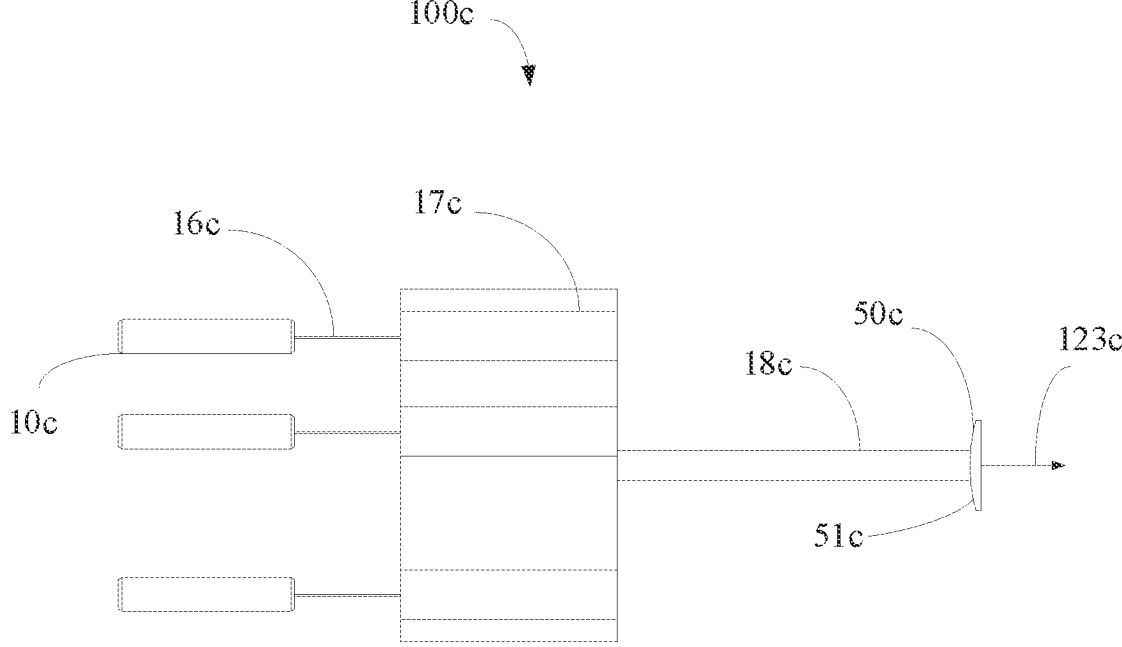
FIG. 3 is a schematic structure diagram of a laser coupling device according to a third embodiment of the present disclosure.

Referring to FIG. 3, the present disclosure provides a laser coupling device 100*c* according to a third embodiment.

The laser coupling device 100*c* includes a plurality of laser units 10*c*, a plurality of input fibers 16*c*, a laser beam combiner 17*c*, an output fiber 18*c*, and at least one first convex lens 50*c*. The input fibers 16*c* are connected between the laser units 10*c* and the laser beam combiner 17*c*, and each input fiber 16*c* is connected with one corresponding laser unit 10*c*. The output fiber 18*c* is connected between the first convex lens 50*c* and the laser beam combiner 17*c*.

In at least one embodiment, the laser unit 10*c* can be a fiber laser transmitter.

In at least one embodiment, the curved surface 51*c* of the first convex lens 50*c* faces the laser unit 10*c*.

In at least one embodiment, a quantity of the at least one first convex lens 50*c* is more than one, and the first convex lenses 50*c* are parallel to each other.

In at least one embodiment, the first convex lens 50*c* has the same structure as the first convex lens 50*a*. So that, a central thickness of the first convex lens 50*c* is 2.25~5 mm. For example, the central thickness of the first convex lens 50*c* is 2.25 mm, 2.5 mm, 3 mm, 3.5 mm, 4 mm, 4.5 mm, or 5 mm. A curvature radius of the first convex lens 50*c* is 24.12~53.6 mm. For example, the curvature radius of the first convex lens 50*c* is 24.12 mm, 26 mm, 30 mm, 35 mm, 40 mm, 45 mm, 50 mm, 55 mm, or 53.6 mm. A diameter of the first convex lens 50*c* is 9.45~21 mm. For example, the diameter of the first convex lens 50*c* is 9.45 mm, 10.5 mm, 12 mm, 15 mm, 20 mm, or 21 mm.

In at least one embodiment, the laser beam combiner 17*c* can be a power combiner or a pump combiner. The power combiner can direct single-mode lasers into the output fiber to acquire one single laser beam with a high output power. The power combiner is also known as single-mode-multi-mode fiber combiner. The pump combiner can direct pump lasers into the output fiber to acquire one single laser beam with a high pump power. The pump combiner is also known as multi-mode-multi-mode fiber combiner.

In at least one embodiment, the input fibers 16*c* can be the same.

As a wave-guide medium, the fiber has advantages of small core diameter, excellent flexibility, easy to acquire a laser beam with a high power density. The fiber laser has advantages of high conversion efficiency, low threshold, high gain, and can output laser beam with a good quality. Moreover, the fiber can also shape the laser beam, so as to improve the quality of the superimposed laser beam emitted from the output fiber 18*c*.

In the technical solution of the present disclosure, the laser beams emitted from the laser units 10*c* are directed into the input fibers 16*c*, the laser beam combiner 17*c*, and the output fiber 18*c* in sequence, to form one laser beam with a high power. The first convex lens 50*c* can converge the laser beam to form one laser beam 123*c* with a higher power.

The above description is merely some embodiments. It should be noted that for one with ordinary skills in the art, improvements can be made without departing from the concept of the present disclosure, but these improvements shall fall into the protection scope of the present disclosure.

What is claimed is:

1. A laser coupling device, comprising: a plurality of laser units, configured to emit laser beams; and at least one first convex lens, arranged on optical paths of the laser beams and configured to converge the laser beam;

wherein the plurality of laser units comprise: a first laser unit, configured to emit a first laser beam in a first polarization state; and a second laser unit, configured to emit a second laser beam in the first polarization state;

wherein the laser coupling device further comprises:

a half wave plate, arranged on an optical path of the second laser beam and configured to change the first polarization state of the second laser beam to obtain a third laser beam in a second polarization state;

a polarization beam combiner, arranged on optical paths of the first laser beam and the third laser beam, and configured to combine the first laser beam in the first polarization state and the third laser beam in the second polarization state into a fourth laser beam;

a beam expander, arranged on an optical path of the fourth laser beam and configured to shape the fourth laser beam; and the first convex lens, configured to converge the fourth laser beam, which has been shaped by the beam expander, to reach a work piece;

wherein, the first polarization state and the second polarization state are two orthogonal polarization states.

2. The laser coupling device according to claim 1, wherein the beam expander comprises:

a concave lens, arranged on the optical path of the fourth laser beam; and a second convex lens, arranged on the optical path of the fourth laser beam, and between the concave lens and the first convex lens.

3. The laser coupling device according to claim 2, wherein a central thickness of the concave lens is 1.35~3 mm; and/or a curvature radius of the concave lens is 5.607~12.46 mm.

4. The laser coupling device according to claim 2, wherein a curved surface of the concave lens is configured to face the second convex lens; and/or a curved surface of the second convex lens is configured to face the first laser unit.

5. The laser coupling device according to claim 2, wherein a central thickness of the second convex lens is 2.25~5 mm; and/or a curvature radius of the second convex lens is 24.12~53.6 mm.

6. The laser coupling device according to claim 1, wherein the half wave plate is perpendicular to the second laser beam.

7. The laser coupling device according to claim 1, wherein one of the first polarization state and the second polarization state is a P polarization state, and the other one of the first polarization state and the second polarization state is an S polarization state.

8. The laser coupling device according to claim 1, wherein the polarization beam combiner is arranged at an angle with the first laser unit; and/or the polarization beam combiner is arranged at an angle with the second laser unit.

9. The laser coupling device according to claim 1, wherein a quantity of the at least one first convex lens is more than one, and the first convex lenses are arranged parallel to each other.

10. The laser coupling device according to claim 1, wherein a central thickness of the first convex lens is 2.25~5 mm; and/or a curvature radius of the first convex lens is 24.12~53.6 mm; and/or a diameter of the first convex lens is 9.45~21 mm.

11. The laser coupling device according to claim 1, wherein a curved surface of the first convex lens is configured to face the laser units.

12. The laser coupling device according to claim 1, further comprising:

a plurality of fast-axis collimation lenses, each of the fast-axis collimation lenses is arranged on one corresponding laser unit;

a plurality of slow-axis collimation lenses, each of the slow-axis collimation lenses is arranged on one corresponding optical path of the laser beam, the fast-axis collimation lenses and the slow-axis collimation lenses are configured to collimate the laser beams; and a plurality of reflecting elements, each of the reflecting elements is arranged on one corresponding optical path of collimated laser beam, and configured to reflect the collimated laser beam.

13. The laser coupling device according to claim 12, wherein an aperture of the fast-axis collimation lens is 0.72~1.6 mm; and/or a focal length of the fast-axis collimation lens is 540~1200 μm; and/or a back focal length of the fast-axis collimation lens is 126~280 μm.

14. The laser coupling device according to claim 12, wherein a center thickness of the slow-axis collimation lens is 2.25~5 mm; and/or a curvature radius of the slow-axis collimation lens is 5.607~12.46 mm.

15. The laser coupling device according to claim 12, wherein a curved surface of the slow-axis collimation lens is configured to face the corresponding laser unit.

16. The laser coupling device according to claim 12, wherein the reflecting element is arranged at an angle with the slow-axis collimation lens.

17. The laser coupling device according to claim 1, further comprising:

a plurality of input fibers, each input fiber is connected with one corresponding laser unit;

a laser beam combiner, configured to combine the laser beams passing through the input fibers into one laser beam; and an output fiber, configured to transmit the laser beam to the at least one first convex lens.

18. The laser coupling device according to claim 17, wherein the laser beam combiner is a power combiner or a pump combiner.

\* \* \* \* \*